(12) United States Patent
Springthorpe et al.

(10) Patent No.: US 6,653,213 B2
(45) Date of Patent: Nov. 25, 2003

(54) STRUCTURE AND METHOD FOR DOPING OF III-V COMPOUNDS

(75) Inventors: Anthony J. Springthorpe, Richmond (CA); Richard W. Streater, Ottawa (CA); Aniket Joshi, West Vancouver (CA)

(73) Assignee: Bookham Technology, plc, Abingdon (GB)

(*) Notice: Subject to any disclaimer, the term of this patent is extended or adjusted under 35 U.S.C. 154(b) by 30 days.

(21) Appl. No.: 09/741,350

(22) Filed: Dec. 21, 2000

(65) Prior Publication Data

US 2002/0081764 A1 Jun. 27, 2002

(51) Int. Cl.[7] .................. H01L 21/00; H01L 21/425; H01L 27/10
(52) U.S. Cl. .................. 438/514; 438/46; 438/474; 438/520; 438/47; 438/45; 257/200; 257/257; 257/201; 257/458
(58) Field of Search .................. 438/514, 474, 438/46, 520, 47, 41, 45, 681, 172, 73, 93, 94, 336, 363, 413, 495, 798, 930, 559; 257/200, 257, 458, 201, 12

(56) References Cited

U.S. PATENT DOCUMENTS

| | | | |
|---|---|---|---|
| 5,169,798 A | | 12/1992 | Eaglesham et al. |
| 5,753,545 A | * | 5/1998 | Liu et al. .................. 438/172 |
| 6,100,542 A | * | 8/2000 | Kohara et al. .................. 257/20 |
| 6,240,114 B1 | * | 5/2001 | Anselm et al. .................. 327/45 |

OTHER PUBLICATIONS

M.B. Panish and H. Temkin, Gas Source Molecular Beam Epitaxy, Springer Series in Materials Science 26, ISBN 3–540–56540–X Springer–Verlag Berlin Heidelberg, New York, ISBN 0–38–56540–X Springer–Verlag New York Berlin Heidelberg, published 1993.

* cited by examiner

Primary Examiner—Matthew Smith
Assistant Examiner—Igwe U. Anya
(74) Attorney, Agent, or Firm—Lahive & Cockfield, LLP

(57) ABSTRACT

A structure for doping of III-V compounds is provided. The structure is a multi-layered structure in which layers of dopant are alternated with layers of initially undoped III-V compound. Dopant diffuses from the layers of dopant into the layers of III-V compound. The structure does not facilitate the introduction of impurities into the III-V compound during the diffusion of the dopant.

23 Claims, 5 Drawing Sheets

STRUCTURE AND METHOD FOR DOPING OF III-V COMPOUNDS

FIELD OF THE INVENTION

The invention relates generally to semiconducting materials and more particularly relates to the doping of semiconducting materials that are grown with Molecular Beam Epitaxial methods.

BACKGROUND OF THE INVENTION

Laser diodes used as light sources in fiber optic communication systems should produce light with a wavelength in the low loss windows for silica based fibers at approximately 1.3 and 1.55 $\mu$m. Production of light with these wavelengths requires quaternary compounds comprising Group III and Group V elements; these compounds are commonly called III-V's. Two such compounds are GaInAsP and AlGaInAs. The latter of these, AlGaInAs, is of interest since lasers made from this material have decreased temperature sensitivity during operation, allowing them to operate without the need for expensive cooling equipment.

There are two common groups of fabrication methods used to grow III-V compounds. The first group of methods are based on Chemical Vapor Deposition (CVD). Of the various CVD methods Metal-Organic (MO) CVD or Organometallic Vapor Phase Epitaxy (OMVPE) is the principal one. The organic compounds that contain the Group III elements decompose and react on a heated substrate in the presence of gaseous Group V compounds to form the desired III-V compound. The exact compound that is formed is controlled by the relative concentrations of the elements in the vapor phase. MOCVD deposition generally uses zinc (Zn), as the P-type dopant. However, it has been found that p-n junction definition can be difficult due to the Zn diffusion that occurs at typical MOCVD growth temperatures in excess of 600° C. The second group of growth methods are those based on ultra-high vacuum deposition techniques of which the original method is known as Molecular Beam Epitaxy (MBE). In MBE heated elemental sources are used to produce an evaporated beam of atoms, or molecules, which are directed at a heated substrate. MBE deposition generally uses beryllium, as the P-type dopant. Beryllium has shown improved junction definition due to its low diffusivity at doping concentrations and typical MBE growth temperatures of around 500° C. for InP substrate-based III-V alloys. Thus it is easier to define PN junctions in material that is grown with MBE methods. Both of these growth methods are well known in the art and it is therefore unnecessary to enter into a detailed description of them at this time.

A schematic diagram of a generic laser diode structure is shown in FIG. 1. There are three basic layers in overall structure 100. Layer 110 is known as the lower confining layer. This layer may be a binary, ternary or quaternary III-V compound and often has a thickness on the order of a micron. In this example this layer will be assumed to be InP that is doped n-type. Layer 120 forms the "active" layer or the layer that produces light. In its simplest form layer 120 is a single layer however layer 120 will often comprise a plurality of sub-layers, as shown in FIG. 1. This latter structure forms a plurality of quantum wells or a Multi-Quantum Well (MQW) structure. A second, upper confining layer, layer 130, is formed on top of the active layer. This layer, like the lower confining layer is InP in this example and has a thickness on the order of a micron. In order to have a p-n junction structure the upper confining layer is doped P-type. The upper and lower confining layers have higher bandgaps and refractive indices than the active layer, so that both injected charge carriers and the light that is generated by their recombination are confined in the plane of the active layer. The final layer of the laser diode is a contact layer such that a low resistance contact is made to the structure. In the current example this layer is GaInAs, that is lattice matched to InP, and is between 0.2 and 0.5 $\mu$m thick.

An area of considerable interest in fiber-optic based telecommunications are 1.3 $\mu$m, 10 Gb/s lasers. One laser diode for this application comprises an AlGaInAs quaternary active layer and Indium Phosphide (InP) upper and lower confining layers. It is desirable to grow such Al containing III-V compounds with MBE methods as it is known in the art that it is difficult to grow Al containing compounds of the desired purity with MOCVD methods as Al containing precursors used for MOCVD growth are often contaminated with impurities. These impurities can lead to a degradation in the properties of the laser. Also growth of material with the desired quality may require growth at much higher temperatures i.e. greater than or approximately equal to 700° C., which further complicates the production of accurately defined p-n junctions.

MBE methods are desirable for the formation of the Al containing quaternary used for the active layer. However MBE growth of P-type (Be doped) InP, used as the upper confining layer in an AlGaInAs based laser, is known to be susceptible to oxygen contamination. Oxygen may enter via a leaky reaction vessel in either MOCVD or MBE growth systems. However, the primary source of oxygen during MBE growth of InP has been found to be the phosphorus source. It is also known that the oxygen does not enter pure InP, rather it is incorporated into InP during the growth of beryllium doped InP, and to a lesser extent during the growth of Si-InP. It has been found that the presence of beryllium facilitates the incorporation of oxygen into the growing InP. Oxygen enters the lattice as a mid-gap donor level and compensates the holes associated with the beryllium acceptors thereby disrupting the P-type doping.

Moreover it would be desirable to use MBE methods to grow III-V semiconducting compounds that contain Al due to the difficulties in obtaining Al containing MOCVD precursors of adequate purity. However difficulties may arise due to the incorporation of oxygen during beryllium doping of an InP confining layer. Thus, there is a need for a method of doping III-V semiconducting compounds with beryllium that does not facilitate the incorporation of oxygen into the InP.

SUMMARY OF THE INVENTION

The invention is directed to a structure, and method of fabrication, for doping III-V compounds grown by MBE methods. In one embodiment the invention provides for beryllium doping of InP. The structure of the invention is a multi-layered structure in which layers comprising beryllium are deposited between layers of initially undoped InP. Beryllium diffuses from the layers comprising beryllium into the layers of initially undoped InP.

In accordance with one aspect of the invention a semiconducting structure that is comprised by a semiconducting device, whose major constituents include group III and group V elements, forming a III-V semiconducting compound, and whose minor constituents include dopant atoms is presented. The semiconducting structure comprises; a plurality of first layers, the first layers comprising a III-V compound and dopant atoms wherein the dopant atoms are distributed in a substantially uniform manner, and at least one second layer, the second layer comprising dopant atoms such that the concentration of dopant atoms in the second layer is larger than the concentration of dopant atoms in the first layer, and the second layer being located between two first layers.

In accordance with another aspect of the invention a semiconducting structure whose major constituents include indium and phosphorus, forming InP, and whose minor constituents include beryllium is presented. The semiconducting structure comprises; a plurality of first layers comprising InP, the first layers being doped with beryllium, and a plurality of second layers comprising beryllium, the second layers alternating with the first layers in the semiconducting structure wherein the beryllium of the second layers diffuses into the first layers to form a substantially uniform doping of the first layers.

In accordance with another aspect of the invention a method of fabricating a semiconducting structure whose major constituents include group III and group V elements, forming a III-V compound, and whose minor constituents include dopant atoms, the method of fabrication using molecular beam epitaxial methods is presented. The method comprises the steps of; (a) provision of the group V element of the III-V compound, (b) initiating deposition of the group III element of the III-V compound to form a first layer of the desired III-V compound, (c) terminating deposition of the group III element after the formation of a desired layer thickness of the first layer of III-V compound, (d) initiating deposition of the dopant to form a second layer, (e) terminating deposition of the dopant after the desired thickness of the second layer has been deposited, (f) initiating deposition of the group III element of the III-V compound to form a second layer of the desired III-V compound, (g) terminating deposition of the group III element after the formation of a desired layer thickness of the second layer of III-V compound, (h) determining if the required semiconductor structure has been formed, (i) returning to step (d) if the final semiconductor structure has not been formed, and (j) terminating deposition of the group V element after the desired semiconductor structure has been formed.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTIONS OF THE DRAWINGS

The invention will be described with reference to the accompanying drawings, wherein.

DETAILED DESCRIPTION OF EMBODIMENTS OF THE INVENTION

The current invention generally provides a structure and method of formation, for doping a III-V compound, which contains phosphorus, with beryllium. Further the current invention applies to Molecular Beam Epitaxy (MBE) growth methods. In the current embodiment the structure is applied to beryllium doping of InP. The structure of this embodiment comprises alternating layers that are deposited as layers of either undoped InP or layers of beryllium and phosphorus. The beryllium atoms diffuse out of the layer comprising beryllium to form a relatively uniform doping profile of beryllium within the InP. The structure of the current invention further mitigates the formation of highly resistive oxygen compensated InP.

An embodiment presents a structure for beryllium doping of InP. An alternative embodiment of the invention presents a method for the fabrication of this structure.

These two embodiments of the invention will be discussed in parallel to facilitate the discussion.

Figure 1:
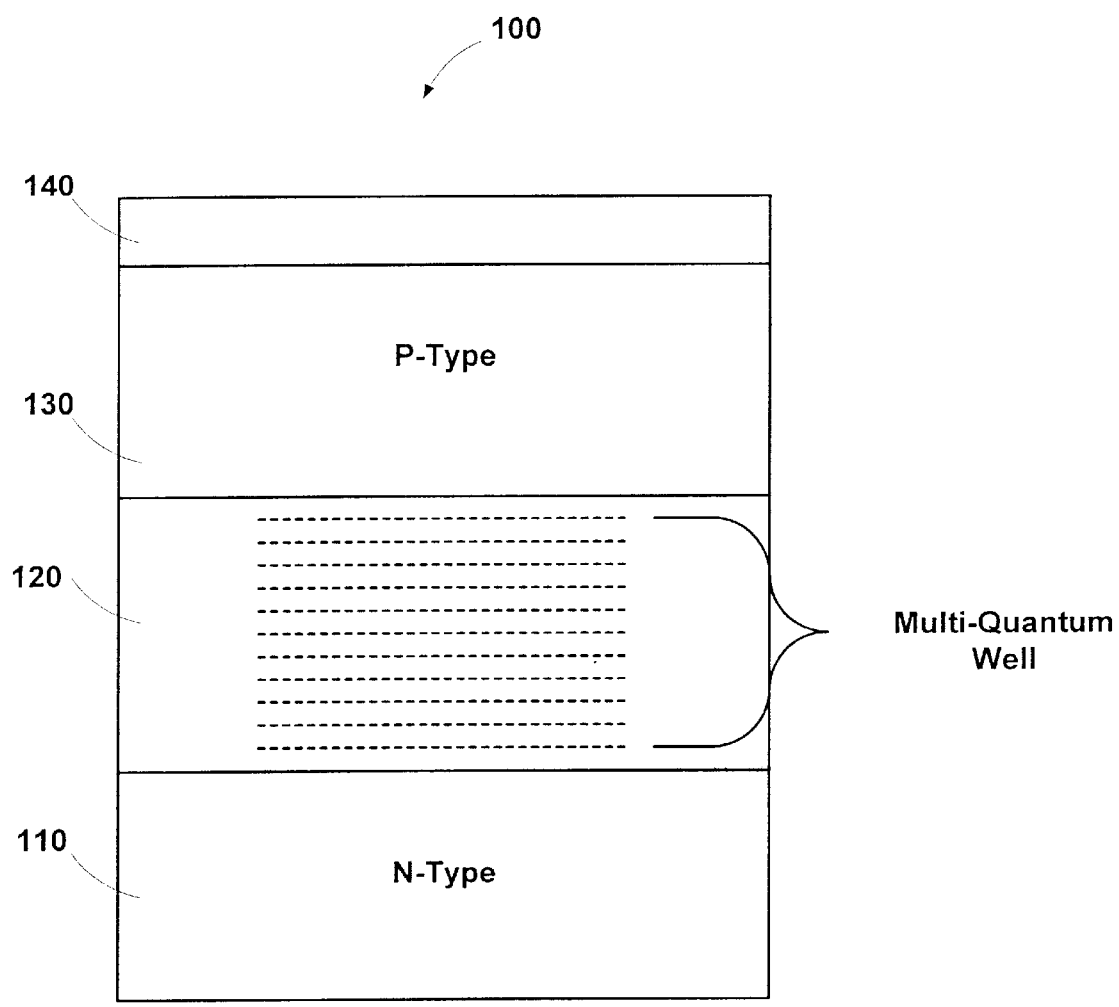
FIG. 1 is a schematic diagram of a cross-section through a generic laser diode (PRIOR ART)
Figure 2:
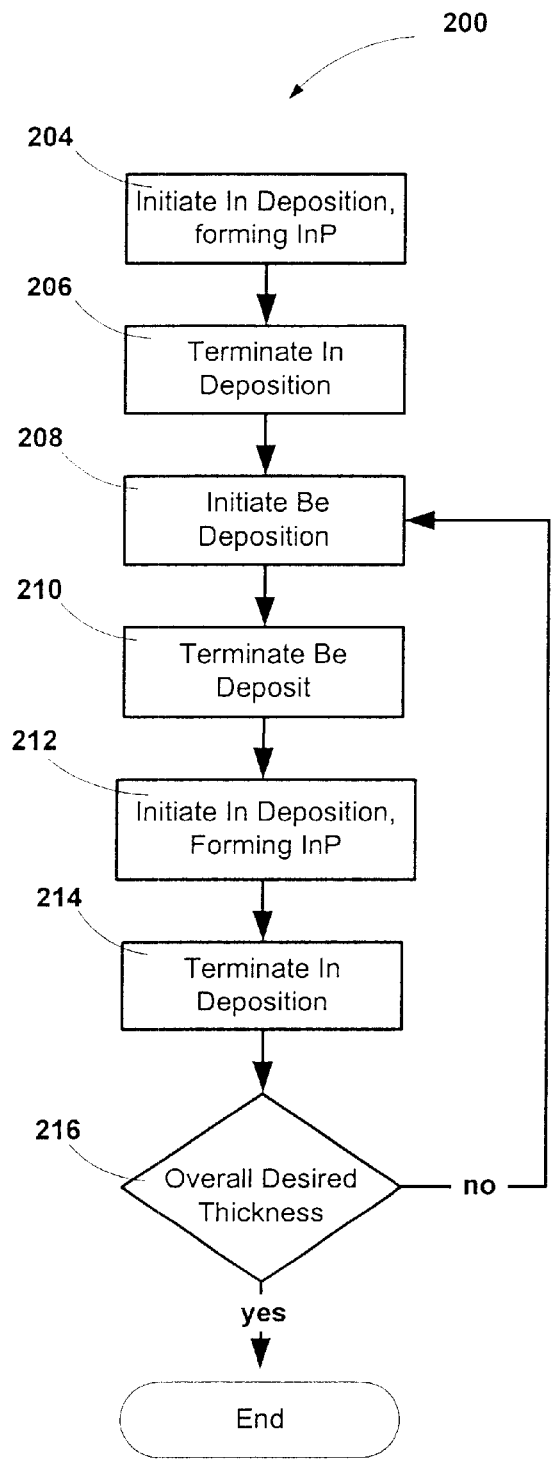
FIG. 2 is flow chart of the basic deposition steps of the invention according to the currently preferred embodiment.
Figure 3:
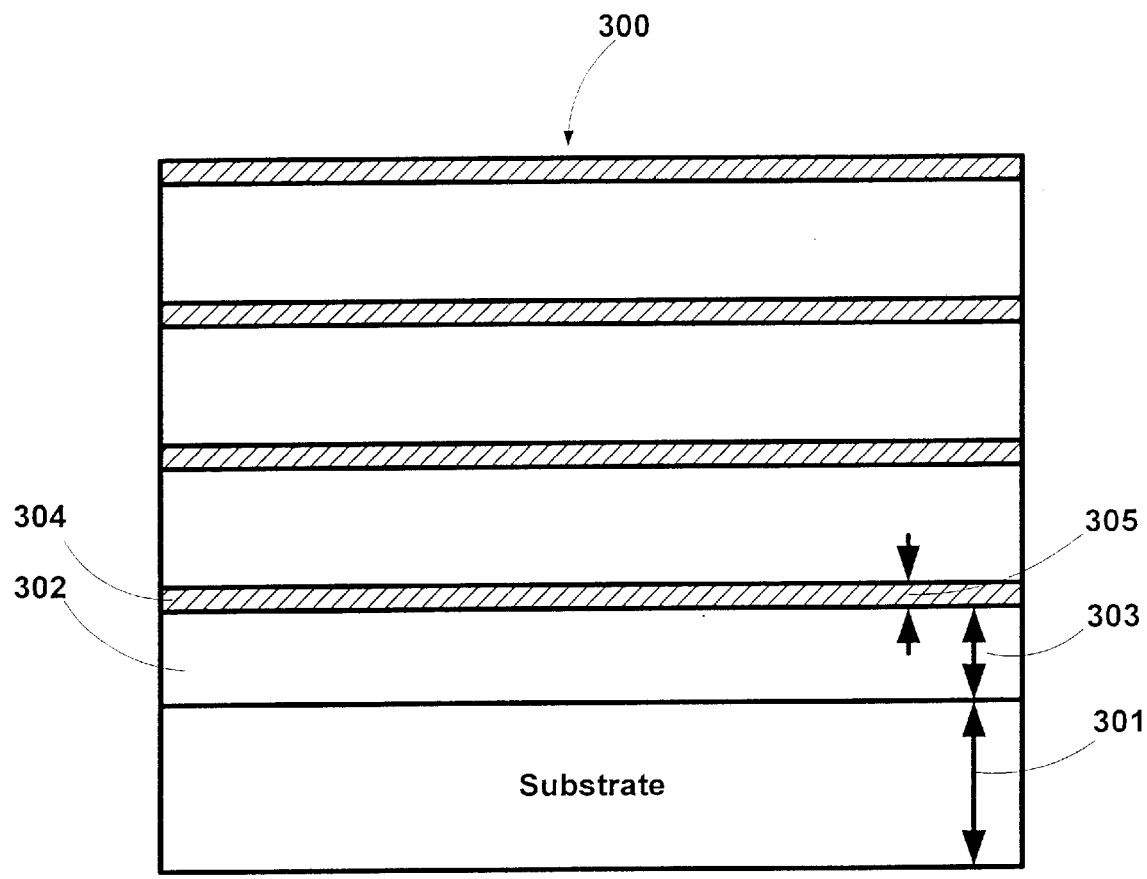
FIG. 3 is a schematic illustration of a cross-section through a structure produced by the methods of the current invention.

A description of the fabrication steps performed during the MBE growth according to the current embodiment of the invention will now be provided. As mentioned MBE methods will be known to those of skill in the art and therefore will not be discussed in detail. The basic steps of the growth process associated with the current invention are outlined in the flow chart presented in FIG. 2. The resultant structure is illustrated in FIG. 3. It should be noted that FIG. 3 is not drawn to scale for ease of illustration. The process outlined in FIG. 2 and the resulting structure of FIG. 3 are not meant to be complete descriptions of a final device structure, rather they outline elements of a final device structure that are comprised by the current embodiment of the invention.

Referring to FIG. 3 the structure of the current embodiment is grown on substrate 301. Substrate 301 can be any appropriate substrate for epitaxial growth as would be apparent to those of skill in the art. The initial InP wafer invariably has a thin coating of native oxide on its surface. This oxide is removed by heating the wafer to a temperature at which it desorbs from the surface. Typically this temperature is in excess of 500° C. A flux of phosphorus atoms is maintained on the surface during the desorption process. This flux of phosphorus is maintained throughout the growth process of the current embodiment. The phosphorus flux ensures excess phosphorus is present at the substrate surface prior to deposition of indium. Further, the phosphorus deposition rate is in excess of that required for stoichiometric InP. It is known in the art that it is desirable to maintain an excess amount of phosphorus (i.e. more than that required for stoichiometry) is desired on the surface of the growing InP layer. This excess phosphorus prevents the surface from becoming metal rich i.e. an excess of indium as compared to stoichiometry. If the InP surface did become metal rich during growth there would be undesirable reconstruction of the surface and epitaxy of the growing InP would be lost.

In the current embodiment the first layer to be grown is undoped InP layer 302. The growth of this layer is initiated with the initiation of indium deposition at step 204. The growth rate of InP is controlled by the arrival rate of the indium atoms. The deposition of indium is continued until InP layer 302 has thickness 303 of 400 nm. Layer 302 is not doped during deposition. With the desired thickness of InP deposited the deposition of indium is terminated at step 206 by closing the shutter to the indium source of the MBE system.

Beryllium deposition is initiated at step 208 which commences the growth of layer 304. Beryllium is deposited until a dose of $1 \times 10^{14}$ atoms/cm$^2$ has been deposited. This dose produces a layer thickness, 305, of less than a monolayer. A thickness of less than a monolayer implies that there are insufficient atoms to provide a continuous layer of beryllium. The dose of beryllium should be sufficient to produce the desired diffusion of beryllium from this layer at the growth temperature of approximately 480° C. In the currently preferred embodiment the deposition is conducted for 72 seconds. The deposition time is controlled by the arrival rate of beryllium atoms. In the currently preferred embodiment the temperature of the beryllium cell is adjusted so that the arrival rate of beryllium would produce a uniform beryllium-doping of $5 \times 10^{18}/cm^3$, in the InP, at a growth rate of 1 $\mu$m/hr. Altering the arrival rate of beryllium atoms will alter the time taken to deposit the $1 \times 10^{14}$ atoms/cm$^2$ of beryllium. Generally shorter deposition times are more desirable, as there is less opportunity for harmful impurities to be incorporated during the interruption in growth of InP. The deposition is terminated at step 210 with the closure of the shutters to the beryllium source of the MBE equipment.

Indium deposition is re-initiated at step 212 to again form a layer of InP. The indium deposition is terminated at step 214 with the desired thickness of InP being formed. At step 216 a query is made as to whether the desired structure has been produced i.e. layer 300 has the desired thickness. If the desired structure has not been produced the process returns to step 208. Thus in terms of overall element quantities the In and P are major constituents of the semiconducting structure while the beryllium is a minor constituent.

Therefore, at the time of deposition of the individual layers, the structure of the current embodiment comprises layers that are either layers of undoped InP (first layers) or layers comprising beryllium and phosphorus that are less than a monolayer thick (second layers). The first and second layers are deposited in an alternating fashion with the minimum structure comprising one beryllium and phosphorus (second) layer between two (first) layers of InP.

The overall resultant structure will be referred to as a δ-doped structure. A δ-doped structure or δ-doping refers to a thin doped layer that resides between thicker undoped layers. The dopant will diffuse from the δ-doped layer into the adjacent undoped layers. In the current embodiment beryllium comprising layers 304 form the δ-doped layers. The δ-doped layers of the current invention do not, at the time the layer is deposited comprise any of the III-V semiconducting compound that is to be doped. It should be noted that upon initiation of In deposition, step 212, the In reacts with the phosphorus of layers 304 to form InP.

The structure that forms subsequent to deposition of the layers will now be considered. If the beryllium atoms of layer 304 were fixed in layer 304 the structure of the current invention would comprise undoped InP layers 302 and beryllium δ-doped layers 304. However, MBE growth occurs at elevated temperatures on the order of several hundred degrees Celsius. In the current embodiment a temperature of approximately 480° C. is maintained during growth. This temperature combined with the large concentration gradient between the InP and beryllium δ-doped layers is sufficient for diffusion of beryllium to occur during the growth of the overall structure.

Figure 4:
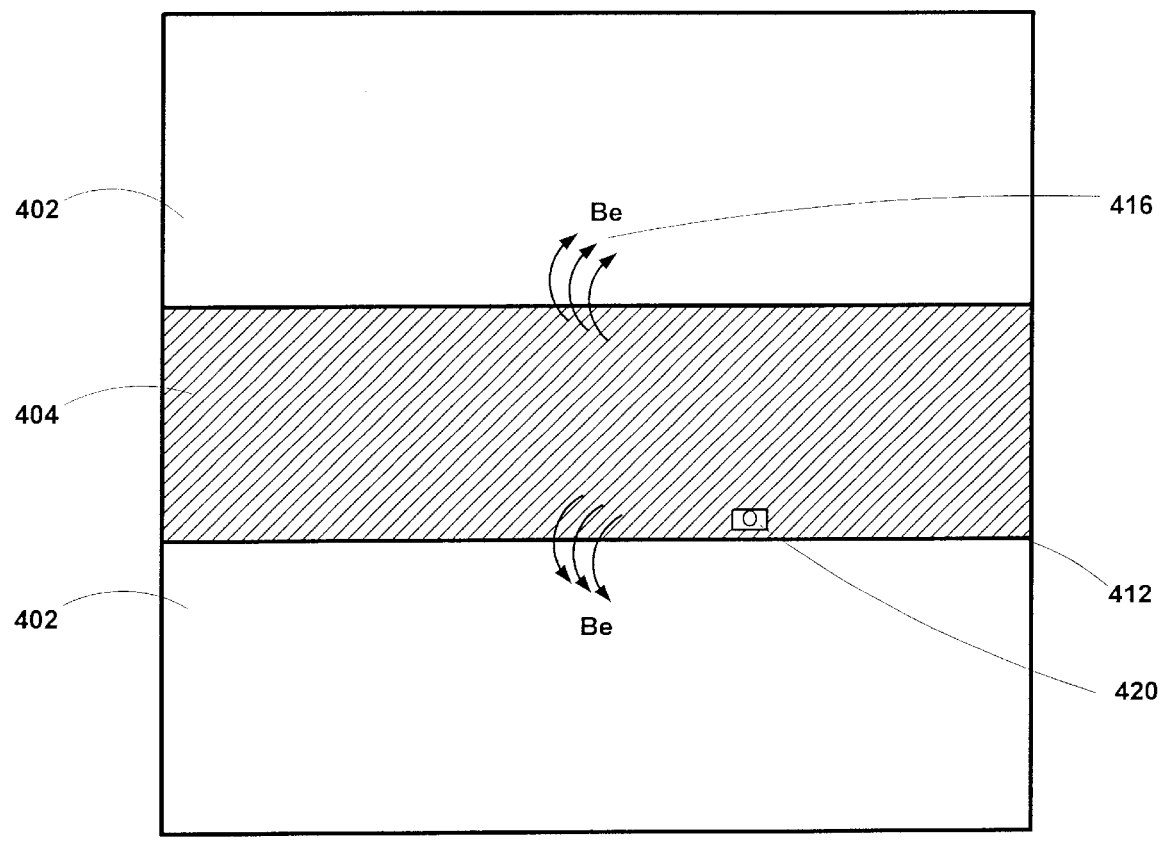
FIG. 4 is schematic illustration of a beryllium δ-doped layer and its interfaces with adjacent InP layers.

FIG. 4 is a schematic diagram of beryllium δ-doped layer 404 and adjacent InP layers 402. As with FIG. 3, FIG. 4 is not drawn to scale for ease of illustration. During growth of the semiconductor device that comprises the structure of the current embodiment beryllium diffuses 416 from δ-doped layer 404 to undoped InP layer 402. This diffusion occurs during the fabrication process and does not require any additional heat treatments. Sufficient diffusion of beryllium takes place at the growth temperature because of the small size of the beryllium atom i.e. high mobility, and the large concentration gradient across interface 412. It will be shown in the Secondary Ion Mass Spectroscopy (SIMS) profiles that the diffusion is sufficient to create an equilibrium distribution of beryllium throughout the structure of the current invention.

It is known in the art that it is desirable to maintain an excess amount of phosphorus (i.e. more than that required for stoichiometry) on surface 412 of the growing InP layer. It is also known that there is often considerable oxygen in the phosphorus source used for MBE growth. This oxygen does not enter undoped InP during growth. However, it is known that oxygen will enter the InP lattice when the growing InP is doped with beryllium i.e. beryllium facilitates the incorporation of oxygen into the InP.

Figure 5:
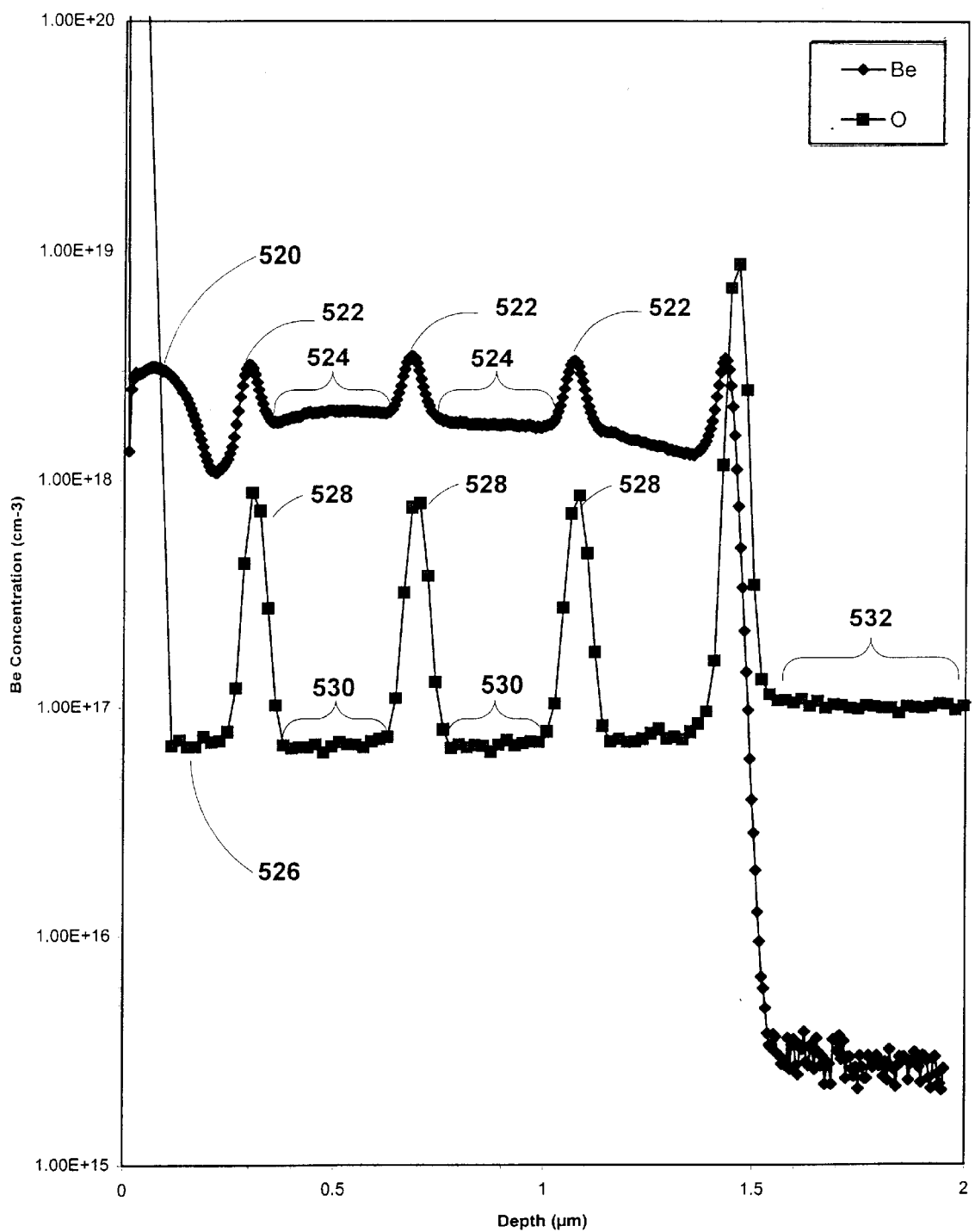
FIG. 5 is a SIMS profile of beryllium and oxygen in a device produced by the methods of the current invention.

The distribution of beryllium and oxygen in another embodiment of the current invention was determined by SIMS analysis. The results of this analysis are shown in FIG. 5. Beryllium profile 520 contains peaks in concentration 522 that coincide with the location of the beryllium δ-doped layers. The beryllium of δ-doped layers 304 has diffused to form a concentration gradient of beryllium. This concentration gradient extends into InP layers 302 where the concentration of beryllium quickly decreases to a plateau value in regions 524. Regions 524 of beryllium profile 520 have a substantially uniform concentration of beryllium of $1.9 \times 10^{18}/cm^3$. Regions 524 comprise the initially undoped layers of InP that are now doped with beryllium that has diffused from the δ-doped layers. Diffusion of the beryllium has produced a substantially uniform beryllium concentration across the originally undoped layers indicating there is sufficient beryllium in the δ-doped layers to effectively dope the InP layers. The peak in profile 520 at the surface is due to an accumulation of atoms at the surface of the layer, whereas the peak at the interface with the substrate is due to an accumulation of material during the warm-up phase of the MBE equipment prior to commencing growth.

Thus diffusion of beryllium from the δ-doped layers into the originally undoped InP layers changes the chemical composition of both InP layers 302 and δ-doped layers 304. The first layers will now be considered as the portion of original InP layers 302 that comprises the substantially uniform concentration of beryllium (regions 524) while the second layers will be considered to comprise the peaks in beryllium concentration 522.

Oxygen profile 526 is quite similar to beryllium profile 520. Profile 526 also contains numerous peaks 528 and regions 530 between peaks. Peaks 528 of the oxygen profile align with peaks 522 of the beryllium profile indicating that oxygen is fixed in the beryllium δ-doped layers and is not distributed uniformly throughout the InP as would be the case with continuous Be doping. SIMS methods cannot resolve layers as thin as the beryllium δ-doped layers of the current embodiment. Therefore the width of peaks 526 of the oxygen profile is a function of the depth resolution of SIMS. The concentration of oxygen in regions 530 is lower than the concentration in the substrate, region 532, and is approaching the detection limit of the SIMS method.

These results indicate oxygen 420 (FIG. 4) has not been incorporated into the InP with the diffusion of beryllium. Rather, oxygen 420 remains in beryllium δ-doped layer 404 indicating the beryllium δ-doped layers act as a source of beryllium for the doping of the layers of InP and as a sink for oxygen originating from phosphorus source.

The final structure of an embodiment of the invention contains layers of InP that are relatively uniformly doped with beryllium and beryllium δ-doped layers that comprise oxygen. Hall effect measurements conducted on an embodiment of the invention found a carrier mobility of approximately 77 $cm^2$/volt/second, which compares favourably with InP structures that have been fabricated by alternative methods. Therefore the structure and method of fabrication of the current invention provides for beryllium doping of InP while not introducing oxygen uniformly into the bulk of the epitaxial InP as would be the case with continuous Be doping.

The current embodiment of the invention presents a structure for beryllium doping of InP. An alternative embodiment presents a method of fabricating this structure. The current invention encompasses additional alternative embodiments. A description of the structure and operation of various embodiments of the invention will now be provided.

The current embodiment presents a "core" structure that can be used to dope a III-V compound. It will be apparent to one skilled in the art that the "core" structure of the current embodiment could be used in alternative embodiments for doping of either the upper or lower confining layers of a laser diode.

The current embodiment was presented with certain doses, growth temperatures, layer thickness, growth rates, concentrations and deposition times. The specific examples presented herein are not meant to limit the invention. Rather a person of skill in the art will realize that there are alternative values for the parameters presented herein that will produce a structure comprising the desired properties of the current invention. The invention thus includes these alternative values.

The current embodiment of the invention presents a structure for the doping of InP with beryllium. The invention should not be limited to either the current dopant or III-V compound. Alternative embodiments of the invention could consider the doping the other III-V compounds that contain P. This would include binary compounds such as GaP, ternaries such as GaInP or AlInP and quaternaries such InGaAsP or GaAlInP.

In the current embodiment the thickness of the beryllium δ-doped layers is less than a monolayer. It was determined by Hall effect measurements that this layer thickness does not interfere with the electrical properties of the semiconducting structure. The current invention should not be limited to δ-doped layers of this thickness. Rather the invention encompasses δ-doped layer thickness' that do not deleteriously affect the electrical properties of the semiconducting structure that contains the structure of the current invention.

While the invention has been described according to what is presently considered to be the currently most practical and preferred embodiments, it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

What is claimed is:

1. A semiconducting structure that is comprised by a semiconducting device, whose major constituents include group III and group V elements, forming a II-V semiconducting compound, and whose minor constituents include dopant atoms, the semiconducting structure comprising:
    a plurality of first layers, the first layers comprising a III-V compound and dopant atoms, wherein the dopant atoms are distributed in a substantially uniform manner; and
    at lease one second layer, the second layer comprising dopant atoms such that the concentration of dopant atoms in the second layer is larger than the concentration of dopant atoms in the first layers, the second layer comprising impurity atoms, and the second layer being located between two first layers; wherein the thickness of the first layers is such that diffusion of dopant atoms from the second layer into the first layer during the growth of an overall semiconducting device is sufficient to produce a substantially uniformly doped first layer.

2. A semiconducting structure according to claim 1 wherein the thickness of the second layer is small enough to allow conduction of electrons across the second layer.

3. A semiconducting structure according to claim 1, wherein the dopant is beryllium.

4. A semiconducting structure according to claim 3 wherein the dopant atoms are deposited as a δ-doped layer.

5. A semiconducting structure according to claim 4 wherein the dopant atoms forming the δ-doped layer are insufficient in number to form a complete monolayer.

6. A semiconducting structure according to claim 1 wherein said impurity atoms are oxygen.

7. A semiconducting structure whose major constituents include indium and phosphorous, forming InP, and whose minor constituents include beryllium, the semiconducting structure comprising:
    a plurality of first layers comprising InP, the first layers being doped with beryllium; and
    a plurality of second layers comprising beryllium, the second layers alternating with the first layers in the semiconducting structure wherein the beryllium of the second layers diffuses into the first layers to form a substantially uniform doping of the first layers and wherein the second layers comprise impurity atoms.

8. The semiconductor structure according to claim 7 wherein thickness of the second layers is thin enough to allow the conduction of electrons across the second layers.

9. A semiconductor structure according to claim 7 wherein the second layers are deposited as a δ-doped layer.

10. A semiconducting structure according to claim 7 wherein the impurity atoms are oxygen.

11. A method of fabricating a semiconducting structure whose major constituents include group III and group V elements, forming a III-V compound, and whose minor constituents include dopant atoms, said method of fabrication using molecular beam epitaxial methods, the method comprising the steps of:
    a) provision of the group V element of the III-V compound;
    b) initiating deposition of the group III element of the III-V compound to form a first layer of the desired III-V compound;
    c) terminating deposition of the group III element after the formation of a desired layer thickness of the first layer of III-V compound;
    d) initiating deposition of the dopant to form a second layer;
    e) terminating deposition of the dopant after the desired thickness of the second layer has been deposited;
    f) initiating deposition of the group III element of the III-V compound to form another layer of the desired III-V compound;
    g) terminating deposition of the group III element after the formation of a desired layer thickness of the second layer of III-V compound;

h) determining if the required semiconductor structure has been formed;

i) returning to step d) if the final semiconductor structure has not been formed; and j) terminating deposition of the group V element after the desired semiconductor structure has been formed.

12. A method according to claim 11 wherein in step (g) the deposition is terminated when the thickness of the first layers is such that diffusion of dopant atoms from the second layer into the first layer during the growth of an overall semiconducting device is sufficient to produce a substantially uniformly doped first layer.

13. A method according to claim 11 wherein in step (e) the deposition is terminated when the thickness of the second layer is small enough to allow conduction of electrons across the second layer.

14. A method according to claim 11 wherein the group V element is phosphorus.

15. A method according to claim 11 wherein the III-V compound is indium phosphide.

16. A method according to claim 11 wherein the dopant is beryllium.

17. A method according to claim 11 wherein steps a)–j) are conducted at a temperature that allows diffusion of dopant atoms from the second layers into the first layers.

18. A method according to claim 11 wherein the dopant atoms are deposited as a δ-doped layer.

19. A method according to claim 18 wherein the dopant atoms forming the δ-doped layer are insufficient in number to form a complete monolayer.

20. A semiconducting structure that is comprised by a semiconducting device, whose major constituents include group III and group V elements, forming III-V semiconducting compound, and whose minor constituents include dopant atoms, the semiconducting structure comprising:

a plurality of first layers, the first layers comprising a III-V compound and dopant atoms, wherein the dopant atoms are distributed in a substantially uniform manner; and at least one second layer, the second layer comprising dopant atoms such that the concentration of dopant atoms in the second layer is larger than the concentration of dopant atoms in the first layers, the second layer comprising impurity atoms, and the second layer being located between two first layers; wherein the dopant is beryllium.

21. The semiconducting structure of claim 20, wherein the dopant atoms are deposited as a δ-doped layer.

22. A semiconducting structure according to claim 21, wherein dopant atoms forming the δ-doped layer are insufficient in number to form a complete monolayer.

23. A semi-conducting structure that is comprised by a semiconducting device, whose major constituents include group III and group V elements, forming a III-V semiconducting compound, and whose minor constituents include dopant atoms, the semiconducting structure comprising:

a plurality of first layers, the first layers comprising a III-V compound and dopant atoms wherein the dopant atoms are distributed in a substantially uniform manner; and at least one second layer comprising dopant atoms such that the concentration of dopant atoms in the second layer is larger than the concentration of dopant atoms in the first layers, the second layer comprising impurity atoms of oxygen, and the second layer being located between two first layers.

* * * * *